United States Patent [19]

Eberhardt

[11] Patent Number: 4,738,024

[45] Date of Patent: Apr. 19, 1988

[54] METHOD OF MAKING A HEAT DISSIPATING ASSEMBLY

[75] Inventor: Noel H. Eberhardt, Cupertino, Calif.

[73] Assignee: Hytek Microsystems Incorporated, Los Gatos, Calif.

[21] Appl. No.: 88,644

[22] Filed: Aug. 24, 1987

[51] Int. Cl.$^4$ .............................................. H09K 3/36
[52] U.S. Cl. ................. 29/830; 174/16 HS; 357/81; 361/386
[58] Field of Search ............ 361/386, 388, 389; 174/16 HS; 29/830, 840

[56] References Cited

U.S. PATENT DOCUMENTS

| | | | |
|---|---|---|---|
| 4,204,248 | 5/1980 | Proffit et al. | 174/16 HS X |
| 4,344,106 | 8/1982 | West et al. | 174/16 HS X |
| 4,387,413 | 6/1983 | Griffis | 174/16 HS X |
| 4,631,819 | 12/1986 | Lasier et al. | 361/386 X |
| 4,669,028 | 5/1987 | Faa, Jr. | 357/81 X |

Primary Examiner—Howard N. Goldberg
Assistant Examiner—Carl J. Arbes
Attorney, Agent, or Firm—Gerald L. Moore

[57] ABSTRACT

A heat dissipating assembly for solid state component and control circuitry therefor including a first printed circuit board [45] having a printed circuit thereon for making connections with electronic components [47], fixing the components to the first circuit board, bending the conductors [49] attached to the components to receive a second circuit board [52] that includes control circuitry for the components, and assembling the joined boards into a housing [40].

8 Claims, 2 Drawing Sheets

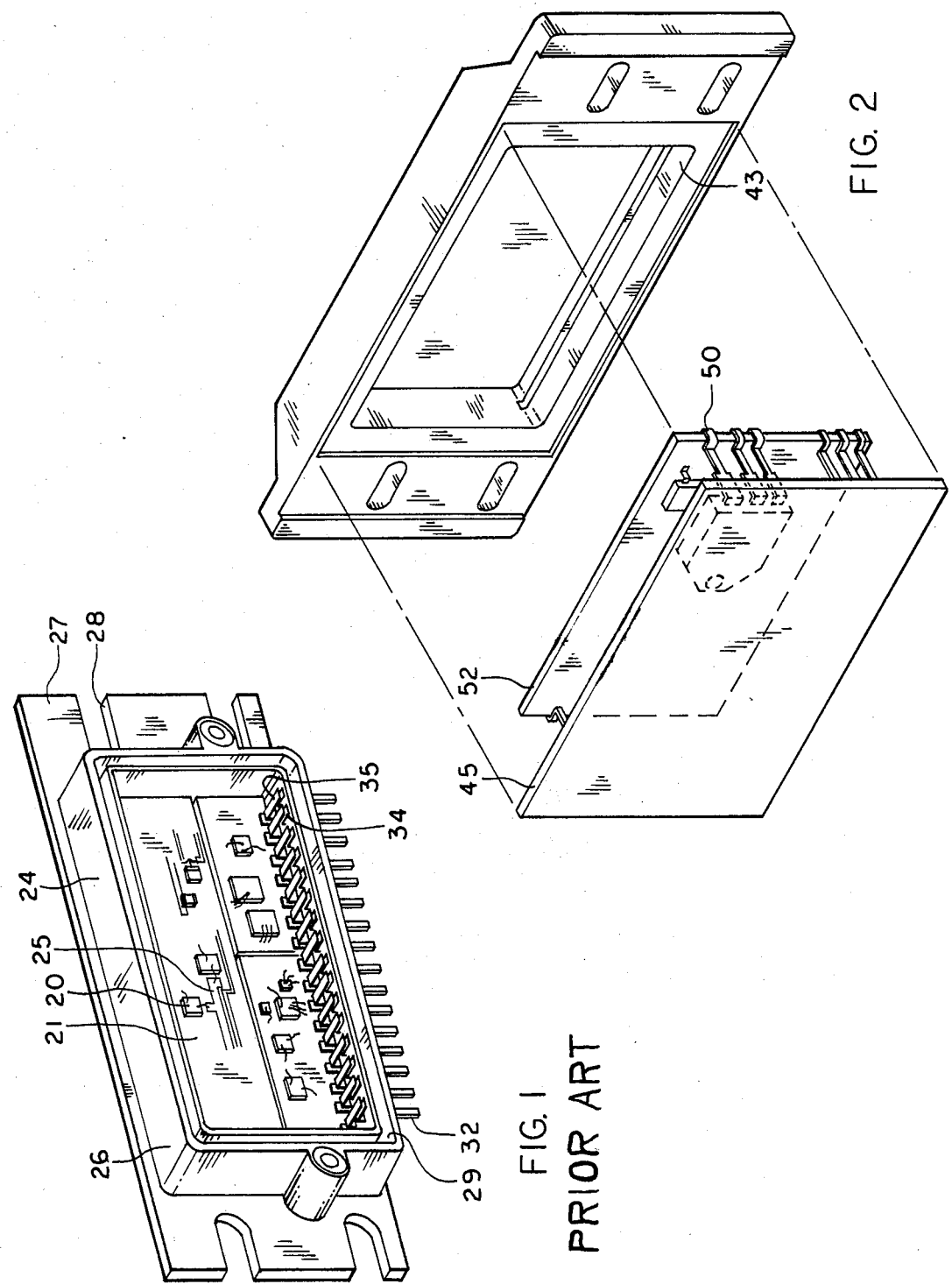

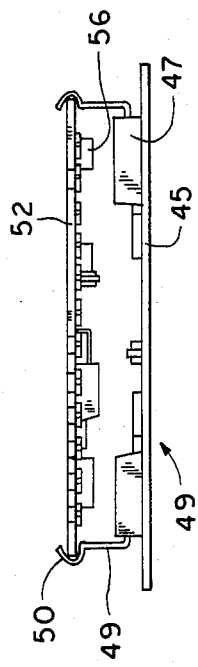
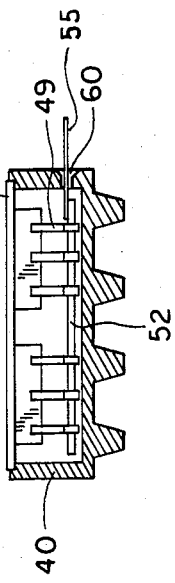
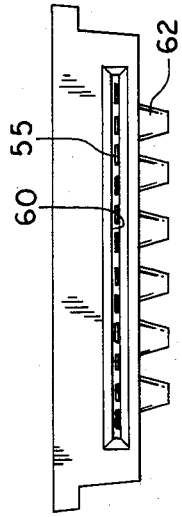
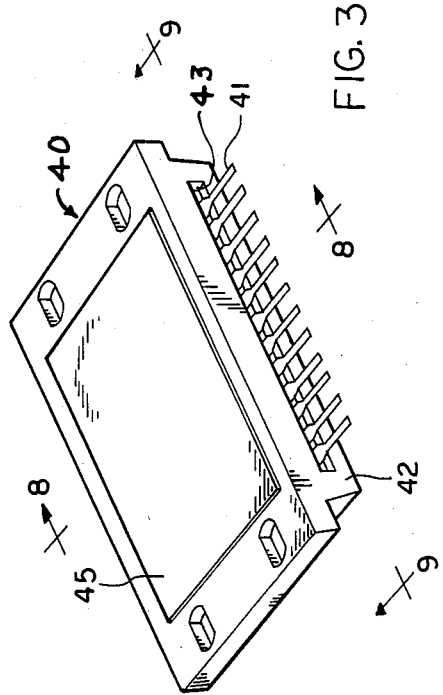
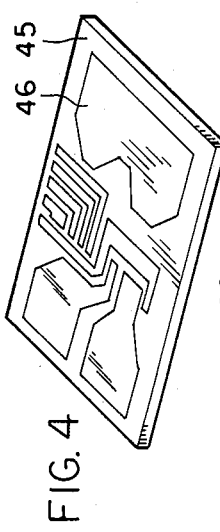
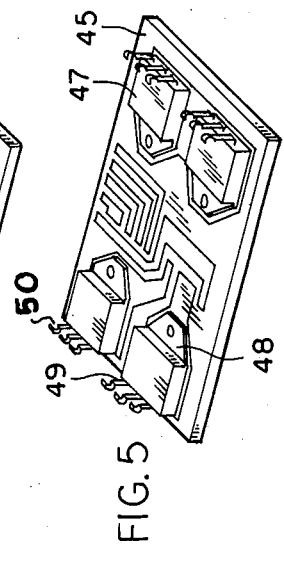
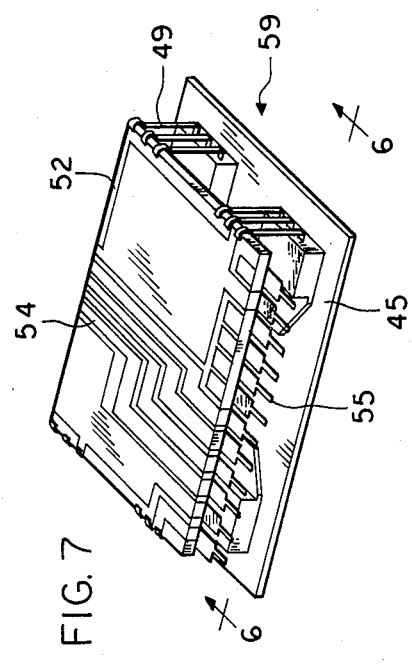

METHOD OF MAKING A HEAT DISSIPATING ASSEMBLY

BACKGROUND OF THE INVENTION

1. Field of the Invention

This invention relates to a process for assembly of solid state devices of the type that require good heat dissipation.

2. Description of the Prior Art

It is advantageous to assemble high current controlling transistors along with the control circuit boards in one assembly for purposes of economy and ease of incorporation with other circuitry. However, difficulties have arisen in that the high current components generate a significant amount of heat which can adversely affect the operation of, and lead to the eventual breakdown of, the control circuit components if not properly dissipated. In the past the components with control circuitry have been mounted on a printed circuit board made of heat conducting material to serve as a heat spreader. This substrate is fixed in a housing and internal connections are made with terminals formed integrally with the housing to complete the circuits. This assembly is expensive because considerable effort is necessary to make all of the electrical connections between the housing terminals and the circuits placed in the housing. The many connections that must be made after the components are within the housing cause the failure rate to be quite high.

It is the purpose of the present invention to provide a process for assembly of an improved heat dissipating, integrated circuit and electronic component device.

SUMMARY OF THE INVENTION

A heat dissipating assembly for high current solid state components including a first board having a printed circuit for making connections with electronic components, fixing said components to said first board, bending rigid leads on the components to extend in a direction away from the board and soldering a second board to the extended leads to position the board for allowing separation from the components for heat spreading and dissipation, and thereafter positioning the assembly in a housing.

DESCRIPTION OF THE DRAWINGS

FIG. 1 shows a prior art method for the assembly of current controlling devices;

FIG. 2 shows the process for mounting a printed circuit board assembly in a housing in accordance with the present invention;

FIG. 3 shows the assembly shown in FIG. 2 completed;

FIG. 4 shows a printed circuit board for supporting electronic components;

FIG. 5 shows the printed circuit board of FIG. 4 with the components attached and the leads formed;

FIG. 6 is an end view of the circuit board of FIG. 5 with the control circuit board attached;

FIG. 7 is a perspective view of the assembly of FIG. 6;

FIG. 8 is an end view of the housing partially cut away to show the circuit board assembly; and FIG. 9 is a view along the line 9—9 of FIG. 3.

DESCRIPTION OF PREFERRED EMBODIMENTS OF THE INVENTION

The overall purpose of the present invention is to package electronic components such as the power generators 20 and the required control circuitry in an efficient and effective manner. Electronic components such as power transistors generate considerable heat because of the high current densities transmitted thereby requiring packaging that spreads and dissipates the heat.

The prior art shown in FIG. 1, illustrates art the power transistors 20 being mounted on a substrate 21 which then is cemented into the housing 24. The substrate 21 is made of a heat conducting material so as to carry heat from the power transistors and the integrated circuit 25 formed thereon. Such a substrate is commonly referred to as a heat spreader. The heat is conducted through the substrate to the base 27. The housing comprises side walls 26 fixed to a base 27 having mounting openings 28 in the ends. The opening 29 is closed by a cover (not shown) held in place by an adhesive.

After the substrate 21 with the components fixed to the integrated circuit formed thereon is placed in the housing, connections must be made between the external terminals 32 molded into the side wall 24 of the housing and the printed circuit 25. Thus welded connections must be made between the ends 34 of the terminals 32 and soldered connections of connectors 35 fixed to and extending up from the printed circuit 25. These solder connections are difficult to make and the soldering process creates the risk of damage to the printed circuit components on the substrate 21. The present invention was made to improve the process of encapsulating a power transistor circuit and the like such as that previously described.

The process and device of the present invention is illustrated primarily in FIGS. 3 through 9. Illustrated in FIG. 3 is the desired assembly comprising a housing 40 similar in size to that shown in FIG. 1, and having connecting pins 41 extending through the wall 42 for making electrical contact. Access to the interior cavity of the housing is gained through the opening 43. As pointed out before, this housing is primarily to protect the circuits mounted therein.

To define the process, there is shown in FIG. 4 a hybrid printed circuit board 45 having metal plates 46 to serve as printed circuits. These printed circuits are configured for making connections to the power transistors 47 illustrated in FIG. 5. While power transistors are shown, other electronic components can also be packaged in the manner to be described. The power transistors are soldered or cemented in the appropriate places to the printed circuit board for making suitable connections between the bases 48 of the components and the circuit conductors. Naturally, the circuit board, including the control circuitry shown in FIG. 1, must serve as a heat spreader and is thereby exposed to relatively high temperatures because of the heat generating effect created by the power components. It is the purpose of the present invention to isolate to the degree possible, the control circuitry from the primary heat generating components.

For this purpose the conductors 49 on the electronic components 47 are bent to extend upward away from the component circuit board 45 and are further configured to form a "C" shaped configuration 50 at the extended end as shown in FIGS. 5 and 6. The second or control printed circuit board 52 includes the control circuitry and other auxiliary circuits necessary for the power components 47. This control circuit board includes a printed circuit 54 and connectors 55 inserted between the extending conductors in the manner shown in FIG. 6. The printed circuit is configured to align with selected terminals 49 on the components and thus make electrical connection therewith. Additionally, the connectors 55 connect with printed circuit portions on both sides of the second board to accommodate discreet components 56 on the underside of the board 52. Thus the conductors 50 are soldered or otherwise attached to the second board 52 for mechanically supporting that board in spaced relationship with the first board 45 primarily to provide thermal isolation therefrom.

FIG. 8 shows, the circuit board assembly 59 is mounted in the housing 40 with the terminals 55 extending through a slot 60 in the side wall 42. The slot 60 around the terminals 41 can be sealed with an insulating material to complete the housing enclosure. Also heat conducting cement can be placed between the first and second circuit boards and the wall members of the housing for better heat conduction. For this purpose the housing also includes projections 62 which serve to better radiate heat into the surrounding atmosphere.

In the manner disclosed, components are assembled on a pair of printed circuit boards in a manner to thermally isolate the control components from the primary heat generating components and thereafter are placed into a housing with no additional solder connections necessary to complete the assembly.

I claim:

1. The method of assembling a power transistor having attached rigid leads and a printed circuit including the control circuit for the power transistor, comprising the steps of:

forming a printed circuit on a first board in a pattern to make electrical connection with a power transistor;

attaching said power transistor to said first board;

bending said rigid leads so they extend away from said first board and above said power transistor;

positioning a second printed circuit board in contact with said extending leads;

soldering said leads to said second board to make electrical connection therewith and to support said second board in spaced relationship with said first board.

2. The method of assembling electronic components having rigid leads and printed circuit boards for supplying current thereto, comprising the steps of:

providing on a first printed circuit board a circuit for making contact with the housing of said components;

attaching said components to said first board;

providing a second printed circuit board including control circuits for said components;

forming said rigid leads to extend away from said first board positions to make electrical contact with and support said second board above and spaced from said components; and fixing said second board to said extended leads to form a complete assembly.

3. The method of claim 2 including the step of providing an outer housing for enclosing said assembly.

4. The method of claim 3 including the step of providing terminals on at least one edge of one of said printed circuit boards.

5. The method of claim 4 including the step of providing an outer housing for enclosing said assembly wherein said outer hosuing includes at least one opening for allowing access to said terminals from the outside.

6. The method of claim 4 including the step of cementing at least one board to the inside walls of said housing.

7. The method of claim 6 including the step of incorporating in said printed circuit boards heat conducting capability so as to transmit heat from said one board to said housing.

8. The method of claim 7 including the step of providing head radiators on the outside of said housing to radiate heat received by the housing from said assembly.

* * * * *